United States Patent [19]

Singh et al.

[11] Patent Number: 5,204,126

[45] Date of Patent: Apr. 20, 1993

[54] MOLD SURFACES WITH ULTRA THIN RELEASE FILMS

[75] Inventors: Brij P. Singh, North Royalton; Raj Subramaniam, Parma, both of Ohio

[73] Assignee: NanoFilm Corporation, Valley View, Ohio

[21] Appl. No.: 774,451

[22] Filed: Oct. 10, 1991

Related U.S. Application Data

[63] Continuation-in-part of Ser. No. 475,777, Feb. 6, 1990, Pat. No. 5,078,791.

[51] Int. Cl.[5] .................. B29C 33/00; B29C 33/60; B29C 39/02
[52] U.S. Cl. .................. 425/412; 249/114.1; 249/115; 249/117; 249/134; 264/2.3; 264/2.5; 264/213; 264/338; 425/436 R; 425/438; 425/441; 425/808
[58] Field of Search .......... 264/2.3, 2.5, 338, 213; 249/114.1, 117; 425/808, 436 R, 438, 441, 412; 106/272, 287.14; 427/35

[56] References Cited

U.S. PATENT DOCUMENTS

| | | | |
|---|---|---|---|
| 3,038,210 | 6/1962 | Hungerford et al. | 264/2.3 |
| 3,671,007 | 6/1972 | Bailey et al. | 264/338 |
| 3,905,823 | 9/1975 | Piskoti | 106/287.14 |
| 3,935,292 | 1/1976 | Okubo et al. | 264/2.3 |
| 4,028,120 | 6/1977 | Edmond | 264/338 |
| 4,277,299 | 7/1981 | Cherenko et al. | 264/338 |
| 4,311,654 | 1/1982 | Blandin | 264/2.3 |
| 4,398,953 | 8/1983 | Van Der Linde | 106/272 |
| 4,504,313 | 3/1985 | Robertson | 264/338 |
| 4,539,061 | 9/1985 | Sagiv | 427/35 |
| 4,595,635 | 6/1986 | Dubrow et al. | 427/54.1 |
| 4,605,567 | 8/1986 | Müller et al. | 427/54.1 |
| 4,681,714 | 7/1987 | Lopes et al. | 264/338 |
| 4,684,538 | 8/1987 | Klemarczyk | 427/54.1 |
| 4,946,369 | 8/1990 | Beck et al. | 264/338 |
| 5,100,590 | 3/1992 | Ruhlin | 425/808 |

OTHER PUBLICATIONS

Anon, Webster's New World Dictionary, World Pub. Co., N.Y. (1957) pp. 1647, 1948.
Anon., Gould Medical Dictionary, McGraw-Hill 1979, p. 66, copy in PTO Scientific Library.
Anon. Webster's New World Dictionary, World Pub. Co. N.Y. 1957, pp. 1647, 1648 and 1677.
Blakiston's Gould Medical Dictionary, (1979) McGraw-Hill, N.Y., p. 66.

*Primary Examiner*—Willard Hoag
*Attorney, Agent, or Firm*—Jones, Day, Reavis & Pogue

[57] ABSTRACT

A film forming composition including a film forming substance having amphiphilic molecules and being dispersed in a gel-like carrier having a non-liquid state below about 20° C. The carrier stabilizes the film forming substance, and inhibits diffusion of moisture and oxygen into the composition. This minimizes deterioration of the film forming substance, and also minimizes undesirable formation of agglomerations of such substance. When the composition is applied to a surface, an ultra thin substantially continuous film of substantially uniform thickness forms spontaneously and attaches to the surface. The excess composition is then washed away.

17 Claims, 2 Drawing Sheets

MOLD SURFACES WITH ULTRA THIN RELEASE FILMS

BACKGROUND OF THE INVENTION

This application is a continuation-in-part of Ser. No. 475,777, filed Feb. 6, 1990, now U.S. Pat. No. 5,078,791 issued Jan. 7, 1992. This application relates to the art of coating compositions, to methods for providing surfaces with coatings, and to surfaces having improved coatings thereon. The invention is particularly applicable to ultra thin films formed by amphiphilic molecules, and will be described with specific reference thereto. However, it will be appreciated that certain features of the invention have broader aspects, and may be used with other types of film forming substances and coating compositions.

Compositions having ingredients that are capable of forming thin films on substrates are discussed in an article entitled Oleophobic Monolayers, by W. C. Bigelow et al., J. Colloid Sci. I, pages 513–538 (1946); in an article entitled Wettability and Conformation of Reactive Polysiloxanes, by Lieng-Huang Lee, Journal of Colloid and Interface Science, Vol. 27, No. 4, Aug. 14, 1968, pages 751–760; in an article entitled Electrical Conduction Through Adsorbed Monolayers, by E. E. Polymeropoulos et al., J. Chem. Phys. 69(5), Sept. 1, 1978, pages 1836–1847; and in U.S. Pat. No. 4,539,061 issued Sept. 3, 1985, to Jacob Sagiv, for a Process for the Production of Built-Up Films by the Stepwise Adsorption of Individual Monolayers. The disclosures of which are hereby incorporated herein by reference. These compositions use thin solvents in which a film forming substance is soluble. In general, the solvents are toxic and environmentally unsafe. Highly liquid compositions also lose their usefulness very rapidly when exposed to airborne moisture and/or oxygen. Highly reactive materials tend to form molecular agglomerations and precipitate out of solution.

It would be desirable to have a film forming composition that is not noxious or hazardous to persons or the environment, and that would provide optimum protection and stability for a film forming substance in the composition. At the same time, it would be desirable to provide such a composition that is easily applied to substrate surfaces to form a substantially continuous ultra thin film of substantially uniform thickness thereon.

Molds for casting optical lenses are usually provided with a release coating for allowing a cast lens to be easily separated from the mold without damaging the surface of the cast lens. The mold must be thoroughly cleaned and provided with a new release coating for each lens that is cast.

It would be desirable to provide a mold with a release coating that could be used for casting a plurality of lens or other articles, and that would require minimal cleaning before being ready for reuse.

SUMMARY OF THE INVENTION

Film forming substances used in the compositions of the present application are capable of forming films and attaching to substrates by reactions and forces of the type discussed in the aforementioned articles by Bigelow et al., L. H. Lee, E. E. Polymeropoulos et al., and J. Sagiv. The film is chemically bound to a surface on which it forms.

A film forming substance capable of forming a substantially continuous ultra thin film of substantially uniform thickness is dispersed in a carrier having a non-liquid state at temperatures below about 20° C.

Unlike prior arrangements requiring use of a solvent in which a film forming substance is soluble, the present application makes it possible to use a carrier in which the film forming substance is either soluble or insoluble. When using a carrier in which the film forming substance is insoluble, the film forming substance is uniformly dispersed throughout the carrier to provide a substantially homogeneous mixture.

The carrier is preferably non-aqueous and is preferably insoluble in water. However, aqueous carriers may be possible for certain applications. Also, the carrier preferably has a substantially neutral pH, although acidic or basic carriers may be used for certain purposes.

The carrier is preferably a gel or gel-like material which inhibits diffusion of moisture and/or oxygen into the composition to thereby stabilize the film forming substance and minimize deterioration of same.

In the present application, amphiphilic molecules form an ultra thin substantially continuous film of substantially uniform thickness, and attach to a substrate surface from a composition having a gel or gel-like state, instead of a liquid state, at temperatures below about 20° C.

In the most preferred arrangement of the present application, the film forming substance consists essentially of amphiphilic molecules. That is, the film formed on a surface using the composition of the present application is formed solely from amphiphilic molecules in the composition.

Film formed in accordance with the present application is characterized by its substantially uniform thickness not greater than about 0.5 micron more preferably not greater than about 10 nanometers.

Compositions of the present application have a preferable consistency range at 25° C. of about 35–400 by the cone penetration test. However, a lower consistency can be used, and the consistency is preferably not greater than about 400 at 25° C.

The preferred melting point is higher than about 30° C., and most preferably higher than about 50° C. A preferred melting point range is about 30°–80° C., although higher melting points can be used by preheating the composition and/or the substrate to which it is applied. Lower melting point compositions are preferred for ease of application, and minimize or eliminate the need to preheat the composition and/or substrate.

Compositions of the present application can employ up to about 0.5% by weight of a catalyst, such as zinc chloride, aluminum chloride or mineral acids, to enhance film formation.

Compositions of the present application can employ up to about 0.5% by weight of a quencher, such as one or more of amines, aluminum and zinc powder, and metal carbonates for reaction with noxious fumes. For example, if the composition uses materials that react to form acid fumes, the quencher will neutralize the acid fumes by forming a salt.

Compositions of the present application are particularly useful for providing ultra thin films on cookware, and especially glass cookware, on glass laboratory ware, on glass and plastic eyewear lenses, and on internal surfaces of molds used for casting optical lenses of plastic materials.

Compositions of the present application can change the surface energy of surfaces to which they are applied.

Preferred films formed in accordance with the present application are substantially invisible unless a dye is added to the composition or incorporated in the amphiphile.

The composition of the present application is applied to a substrate surface, and a substantially continuous ultra thin film of substantially uniform thickness is allowed to form from the amphiphilic molecules in the film forming substance. The molecules also attach themselves to the substrate surface by various forces and bonds as discussed in the aforementioned articles, and are primarily chemically bound to the surface. Subsequently, the excess material is washed away, such as with soap and water. A substantially continuous ultra thin film of substantially uniform thickness remains on the substrate surface, and provides excellent abrasion and stain resistance, along with excellent release properties. The properties imparted to the substrate surface by the film can be varied by selecting different film forming substances.

The method of the present application for providing a substantially continuous ultra thin film of substantially uniform thickness to a substrate surface is essentially carried out in three steps. First, a homogeneous coating composition is made by dispersing a film forming substance in a carrier having a viscosity such that diffusion of moisture and/or oxygen into the composition is inhibited. This stabilizes the film forming substance and minimizes deterioration of same. Small quantities of one or both of a catalyst and quencher may be included in the composition. Second, the composition is applied to a substrate surface. Third, the amphiphilic molecules in the film forming substance are allowed to form a substantially continuous ultra thin film of substantially uniform thickness that attaches to the substrate surface. Film forming substances containing polymerizable moieties are polymerized by heating, photochemical reaction and/or use of a catalyst. Excess coating material is then washed away.

It is a principal object of the present invention to provide an improved coating composition and method for providing ultra thin films on substrate surfaces.

It is another object of the invention to provide a coating composition having a substantially neutral carrier that is environmentally safe and non-toxic to persons.

It is an additional object of the invention to provide an improved coating composition and method for forming ultra thin films in a manner that does not release hazardous materials to the environment, or create a noxious or hazardous environment for workers.

It is a further object of the invention to provide a coating composition containing a film forming substance that is very stable and resistant to deterioration, while being very reactive for film formation.

It is another object of the invention to provide a coating composition having an extremely low moisture content and a very low affinity for moisture.

It is another object of the invention to provide a coating composition that inhibits diffusion of moisture into the composition to thereby minimize deterioration of a film forming substance within the composition.

It is also an object of the invention to provide improved substrate surfaces, such as on glass, ceramic and porcelain cookware, laboratory ware, glass and plastic eyewear lenses, and molds made from or lined with glass, porcelain or chrome.

It is another object of the invention to provide a commercially cost effective composition and method for modifying surface properties of substrates by forming substantially continuous ultra thin films of substantially uniform thickness thereon.

It is a further object of the invention to provide an improved mold for casting optical lenses.

DESCRIPTION OF PREFERRED EMBODIMENTS

Figure 1:
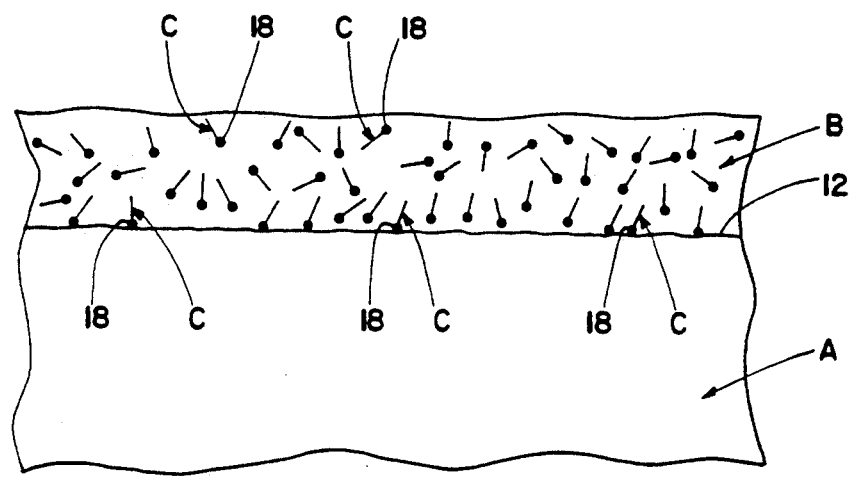
FIG. 1 is a partial side elevational view showing a film forming composition spread on a surface.

As used in this application, a film forming substance is one containing amphiphilic molecules that are capable of forming a substantially continuous ultra thin film of substantially uniform thickness on a substrate surface. In this application, a substantially continuous film is one that is substantially unbroken except for the presence of relatively minor defects or imperfections such as pin holes.

An amphiphile contains a polar region and a nonpolar or apolar region. Amphiphiles that can be used to form film in accordance with the present application include, but are not necessarily limited to, the following:

The polar segment of the amphiphile can be a carboxylic acid or its salts, alcohols, thiols, amides, primary, secondary, tertiary amines, cyanides, nitrates, phosphates, silane derivatives, sulfonates and the like.

The non-polar or apolar component typically consists mainly of alkyl and alkyl ethers or fluorinated alkyls or alkyl ethers. These apolar regions may include diacetylene, vinyl-unsaturated, or fused linear or branched aromatic moieties. In addition the apolar region may contain organic dyes with or without metal, such as pthalocyanines, porphyrins and phenol blues.

In one preferred arrangement, the film forming substance consists essentially of $R_mSiX_n$ where the nonpolar R is an alkyl or alkyl ether or fluorinated alkyl or alkyl ether group of about 6-30, and most preferably about 12-30, carbon atoms long. The film forming substance, and particularly the alkyl or fluorinated alkyl group, may include one or more of polymerizable moieties, dyes or dipoles. In the above formula, X is selected from the group consisting essentially of halogens, hydroxy and alkoxy. In the formula, m is 0-3, n is 1-4, and m plus n equal 4. In still another preferred arrangement, R may be a substituted silane or siloxane.

Obviously, the film forming substance can be a mixture of a plurality of different types of $R_mSiX_n$ in any proportion, such as one where R is 10, one where R is 12 and one where R is 14. These can be mixed in various amounts, such as, by way of example only, 30% where R is 10, 50% where R is 12 and 20% where R is 14.

The film forming substance is thoroughly mixed and uniformly dispersed in a carrier to provide a substantially homogeneous composition. The carrier is preferably one that has a non-liquid state at temperatures below about 20° C. Most preferably, the carrier is one having a substantially neutral pH, although other types of carriers can be used for certain purposes. Most preferably, the carrier is one that meets Food and Drug Administration Regulations 21 CFR 172.880 and 178.3700 for direct and indirect use in food for human consumption.

The carrier used in the composition of the present application is preferably a gel or gel-like material at temperatures below about 20° C. Various grades of petrolatum can be used for the carrier. These petrolatums are of the type used as carriers, emollients, lubricants, base ingredients, binders, protective coatings, plasticizers, waterproofing, release agents, and softeners. The carrier may also be a mineral jelly compounded from white mineral oils, petrolatums and paraffin waxes. The carrier may also be a hydrogenated or partially hydrogenated vegetable or animal oil. Various mixtures of the aforementioned carriers are also possible.

Most preferably, the carrier is one that is not soluble in water. However, carriers that are soluble in water can be used for certain purposes. The carrier may be one in which the film forming substance is insoluble. Other carriers that may be possible for certain purposes include silicone jelly. Water based gels may also be used when the film forming substance does not react with water. The carrier is preferably one that has an extremely low moisture content and most preferably is one that has been rendered anhydrous.

The highly viscous carrier stabilizes the film forming substance by maintaining same randomly dispersed throughout the carrier. The carrier also inhibits absorption of airborne moisture and/or oxygen into the composition.

A small quantity of a catalyst may be uniformly mixed in the composition to enhance film formation. For example, up to about 0.5% by weight of one or more of zinc or aluminum chloride or mineral acids may be added to the composition. A small quantity of a quencher may also be added to the composition for neutralizing any acid fumes that may be generated during film formation. For example, up to about 0.5% by weight of one or more of an amine, aluminum or zinc powder, or metal carbonates may be added to the composition as a quencher that will neutralize acid fumes by forming a salt. When more than one quencher is used, the total amount of quencher material is not more than about 0.5% by weight of the entire composition, and the same relationship is used for the catalyst.

The composition and carrier of the present application have a preferred consistency or firmness as determined by a cone penetration test. Examples of consistency will be given as determined by ASTM designation D937-87 approved Oct. 30, 1987, and published in December 1987, the disclosure of which is hereby incorporated herein by reference. The carrier and composition of the present application preferably have a consistency at 25° C. that is in the range of about 35-400, although a lower consistency can be used when the substrate and/or composition is heated before application of same to a surface.

In the cone penetration test for consistency, higher numbers mean that the material is softer because the cone penetrates further. Thus, a material having a consistency of 35 is much firmer and resistant to penetration than a material having a consistency of 400. The consistency of the carrier and composition is preferably less than about 400. A more preferable range is about 150-300.

The preferred melting point of the composition is higher than about 30° C., and most preferably higher than about 50° C. A preferred melting point range is about 30°-80° C., although higher melting points can be used by heating the composition and/or substrate. Lower melting points are preferable for ease of application of the composition to a surface, while eliminating or minimizing the need to preheat the composition and/or substrate. The melting point may be determined in accordance with ASTM designation D127.

The composition of the present application can be applied to substrate surfaces in any suitable manner, such as by wiping, brushing, rolling, spraying, dipping or the use of a doctor blade. The composition can also be foamed as it is applied to a substrate surface or as an article to be coated with film is passed through the foam.

To form a substantially continuous ultra thin film of substantially uniform thickness on a substrate surface, the surface is completely covered with the composition. The composition is allowed to remain on the surface for a sufficient period of time to allow the film to form and attach to the surface. The amount of time required for film formation and bonding to the surface depends upon the type of substrate, the consistency of the composition, the temperature and the particular film forming substance being used.

Where the film forming substance contains a polymerizable group, the film may be cured by either heating or exposure to a light source, preferably an ultraviolet light source. Polymerization can be initiated at anywhere from 20° C. to 150° C. Heat may be applied by blowing hot air on the surface, by passing the articles through an oven, or by immersing the article in hot water. Polymerization may be effected during a time period up to about 30 minutes. When X in $R_mSiX_n$ is a halogen, polymerization can be completed in less than one minute and, when a non-halogen, can be substantially completed in up to about 30 minutes.

Once the film has formed and is attached to the substrate surface, the excess composition is washed away. The excess composition may be removed with a suitable solution, such as soap and water, and then rinsed. A suitable solvent such as mineral oil may also be used to provide an initial rinse for washing away the excess composition. The substrate surface is left with a film having excellent abrasion and stain resistance, along with excellent release properties. The film is substantially invisible unless a dye has been added to the composition or incorporated in the amphiphile.

The composition and method of the present application are particularly advantageous for providing a film of the type described on non-porous substrates, such as glass, plastics, ceramics, porcelain, fiberglass and metals. Film applied in accordance with the present application is relatively permanent in nature, and resists all common household solvents and chemicals, along with food products and cosmetics. The film is hydrophobic, and also has excellent water beading and anti-stick properties. The film is useful for anti-reflective optics, corrosion protection, friction reduction, print priming, moisture barriers, scratch resistance, security marking, and a mold release coating. The film is particularly advantageous when applied to cookware, and particularly glass or ceramic cookware, to laboratory ware, to eyewear lenses used in eyeglasses, and to inner surfaces of molds used for casting optical lenses of plastic materials.

Film applied with the composition of the present application is useful on any pots, pans, dishes or utensils used for preparing, cooking and serving food. The film is particularly advantageous on such items that are made of glass and are used for cooking, because dried and burned food does not stick to the film.

The film is also advantageous on glass laboratory ware including, but not limited to, laboratory flasks, beakers, test tubes and dishes.

The film is particularly advantageous for use on plastic eyewear lenses, such as aliphatic polycarbonate, used in eyeglasses. An anti-reflective coating and/or scratch resistant coating may be applied to the lenses before the film of the present application is formed thereon. The lenses may have a thin anti-reflective coating of sputtered metal thereon and the film is applied over the anti-reflective coating. The lenses may be hard coated for scratch resistance, such as with a polysiloxane, and the film of the present application is applied over the scratch resistant coating.

In the arrangement of the present application, the sole material that forms the film in-situ on a substrate surface consists essentially of amphilphilic molecules. That is, the sole material in the finished film consists essentially of amphiphilic molecules from the film forming substance. The film is characterized by its highly uniform thickness of not more than about 0.5 microns, more preferably not more than about 10 nanometers.

The film is advantageous as a release coating on mold surfaces, particularly mold surfaces used in casting optical lenses from such materials as aliphatic polycarbonate and other plastic resins.

FIG. 1 shows a substrate A having a surface 12 completely covered by a continuous thin coating of composition B of the present application. Composition B has amphiphilic molecules dispersed therein, and only a few of same are specifically identified by letter C. Each amphiphilic molecule C has a polar end 18 and an opposite non-polar end.

The natural environment atmosphere of the earth always contains some moisture, and objects within such atmosphere also have moisture thereon. Therefore, surface 12 of substrate A has moisture thereon even though it is in such small quantities as to be undiscernable to the eye or touch. Polar ends 18 of amphiphilic molecule C are attracted toward surface 12 and migrate through composition B until they attach to surface 12. Amphiphiles chemically react with hydroxy groups on a glass surface to form a covalent chemical bond. Composition B is simply left on surface 12 for a sufficient period of time to allow enough molecules C to migrate toward and attach to surface 12 and to one another to completely cover surface 12 with a continuous film of molecules C.

The amphiphilic molecules normally comprise about 0.1-20% by weight of the entire composition B, and more preferably about 1-5% by weight of the entire composition B, although larger or smaller amounts can be used. Amphiphilic molecules in the amount of about 2% by weight of the entire composition have been used with good results. Obviously, substantially larger amounts by weight of the amphiphilic molecules can be used. However, larger amounts of the amphiphilic molecules are not necessary and it is generally wasteful to provide substantially larger quantities.

The amount of time required for the molecules to form a continuous film on surface 12 will vary depending upon the amount of amphiphilic molecules in the composition, the viscosity of the composition, the type of substrate, and the temperature conditions. After passage of sufficient time to form and cure a continuous thin film, composition B is washed from surface 12 as with soap and water to leave a continuous thin film of amphiphilic molecules C bonded thereto and to one another.

Figure 2:
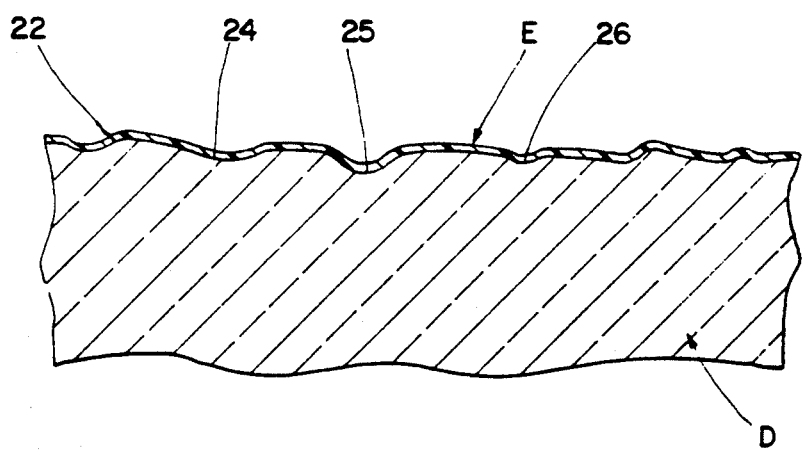
FIG. 2 is a partial cross-elevational view of a surface having a film thereon in accordance with the present application.

FIG. 2 shows a substrate D having a surface 22 covered with a continuous film E consisting essentially of amphiphilic molecules applied in accordance with the present application. A substrate surface to which the film is applied may have some depressions and other irregularities as generally indicated by numerals 24, 25 and 26 in FIG. 2. It is believed that film E of the present application follows the contours of such irregularities as shown in FIG. 2 so that the film is of substantially uniform thickness throughout its entire extent. That is, the film is not self-leveling, and is in contrast to films or coating that are self-leveling and completely fill irregularities in a surface so that the coating or film has many areas of different thickness. It is possible that some areas of the substrate surface, particularly microscopic or fissures, may be filled with the molecules so that a greater thickness would exist. Film E seals the pores of the surface to which it is attached.

Figure 3:
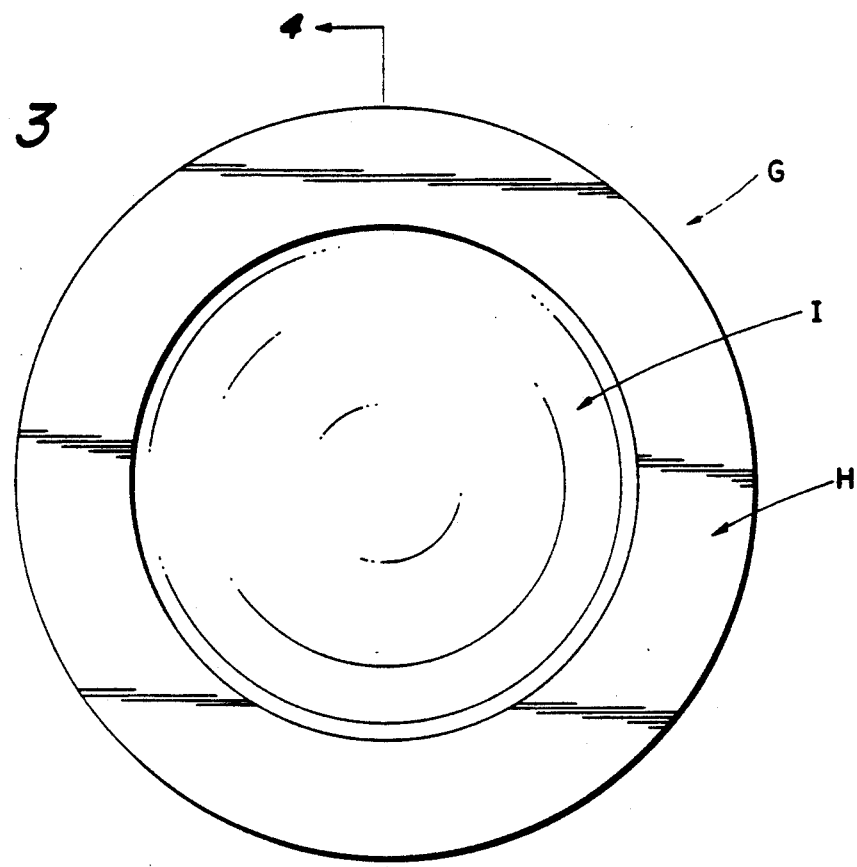
FIG. 3 is a top plan view of a mold for molding optical lenses.
Figure 4:
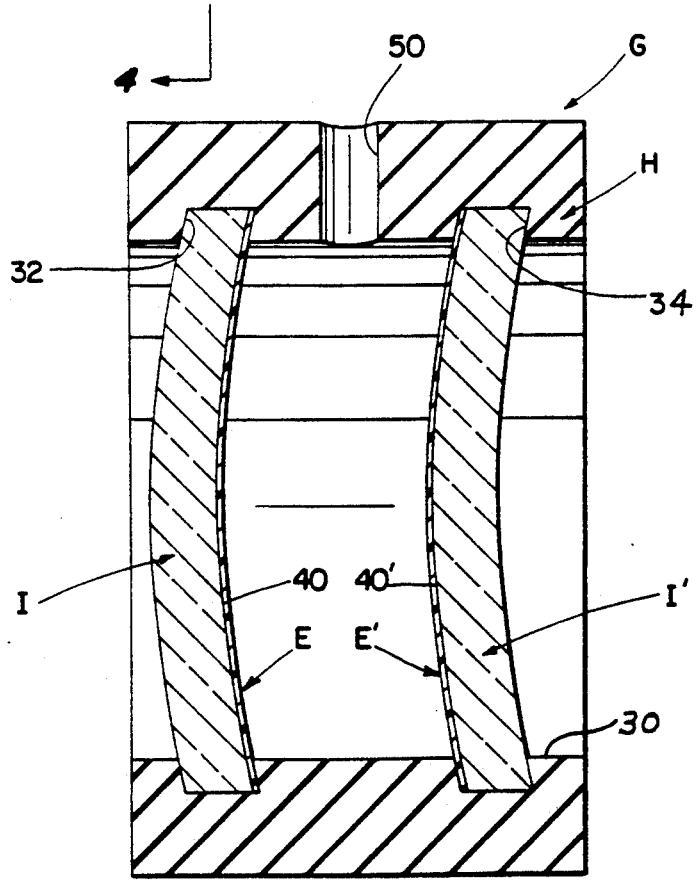
FIG. 4 is a cross-sectional elevational view taken generally on lines 4—4 of FIG. 3.

FIG. 3 shows a mold assembly G for casting optical lenses using plastic material, such as aliphatic polycarbonate. The mold includes an elastomeric ring H that is deformable and stretchable. As shown in FIG. 4, the inner peripheral surface 30 of elastomeric ring H has a pair of axially spaced-apart circumferential grooves 32, 34 therein. A pair of glass molds I, I' have their outer peripheral portions closely received and gripped within grooves 32, 34 in elastomeric ring H.

Glass molds I, I' have inner surfaces 40, 40' that are highly polished to an optically flat finish, and are also curved for providing desired predetermined characteristics to a lens cast in the mold. Inner surfaces 40, 40' are provided with a continuous thin film E, E' of amphiphilic molecules in accordance with the present application. The film is formed on surfaces 40, 40' before assembling glass molds I, I' to ring H. A radial hole 50 in elastomeric ring H located intermediate axially spaced-apart glass molds I, I' is provided for filling the mold cavity with plastic material. The mold cavity between inner surfaces 40, 40' of glass molds I, I' is completely filled with the plastic material, and the entire mold assembly is then submerged in a hot water bath at a temperature of 60°-180° C. for about 1-24 hours. This polymerizes the plastic used to cast the lens.

The mold assembly is then cooled, and the elastomeric ring H is severed and separated from the glass molds and the cast lens. The glass molds are then separated from the cast lens. The inner surfaces of the glass molds having the release coating of film E thereon are then mildly cleaned and assembled with a new elastomeric ring H for use in casting additional lenses.

The release coating provided by film E eventually deteriorates due to oxidation and abrasion but can be reused as a release coating to cast not less than 10 lenses and preferably more than 20 lenses before renewal of the release coating is necessary. Thus, film E minimizes the amount of cleaning necessary before the mold can be reused, and the release coating does not have to be renewed after each lens is cast.

The composition of the present application consists essentially of a film-forming substance and a carrier for the film-forming substance. The composition may include extremely small amounts of non-essential ingredients such as a catalyst, a quencher or a dye. The carrier consists essentially of a material having a non-liquid, gel-like state at temperatures below about 20° C. and a melting point not greater than about 80° C. The film-forming substance is dispersed in the carrier and consists essentially of polymerizable amphiphilic molecules that automatically separate from and migrate through the carrier and self-assemble into a substantially continuous film of substantially uniform thickness not greater than about 10 nanometers. The film chemically bonds to surfaces on which it forms. The remainder of the composition is readily removable and washable from a surface to which it is applied so that only the thin film remains on the surface. The composition of the present application is particularly characterized by the absence of any solid particulate materials that would make it impossible to allow a film to form on a surface in a continuous coating of substantially uniform thickness.

When applied to a mold surface, the film of the present application preferably has a substantially uniform thickness not greater than about 10 nanometers. It is particularly advantageous to apply the film of the present application to mold surfaces of glass, ceramic, porcelain or chrome. However, it will be appreciated that such a film can be applied to a mold of other materials.

When it is desired to renew the coating, heat and/or a strong base solution, such as sodium hydroxide, may be used to remove all of the original coating. The surface is then washed, dried and a new coating applied thereto for forming a new film thereon.

Although the invention has been described with reference to certain preferred embodiments, it is obvious that equivalent alterations and modifications will occur to others skilled in the art upon the reading and understanding of this specification. The present invention includes all such equivalent alterations and modifications, and is limited only by the scope of the claims.

We claim:

1. A mold for casting articles, said mold having inner surfaces coated with a release coating consisting essentially of polymerized amphiphilic molecules that are capable of self-assembly and that are self-assembled on said surfaces.

2. The mold of claim 1 wherein said coating has a thickness not greater than about 10 nanometers.

3. The mold of claim 1 wherein said mold surfaces are highly polished to an optically flat finish.

4. The mold of claim 1 wherein said coating is substantially continuous and has a substantially uniform thickness and is chemically bonded to said surfaces.

5. The mold of claim 1 wherein said mold is of a material selected from the group consisting of glass, ceramic, porcelain, and ceramic.

6. The mold of claim 1 wherein said coated surfaces are in spaced-apart opposed relationship and are curved for molding lenses.

7. The mold of claim 1 wherein said coating is formed by a film forming substance consisting essentially of RmSiXn where R is a substituted silane, a substituted siloxane or an apolar alkyl or a fluorinated alkyl group of about 6-30 carbon atoms which may or may not contain one or more of diacetylene, fused linear moieties or branched aromatic moieties, where m plus n equal four, and wherein x is selected from the group consisting of halogens, hydroxy and alkoxy.

8. The mold of claim 1 wherein said coating is formed by a film forming substance consisting essentially of RmSiXn where R is an apolar alkyl or alkyl ether or a fluorinated alkyl or alkyl ether group of about 6-30 carbon atoms, where m plus n equal four, and wherein x is selected from the group consisting of halogens, hydroxy and alkoxy.

9. A mold for molding optical lenses, said mold having spaced-apart opposed inner surfaces that are curved to provide desired optical characteristics for a lens molded therein, said surfaces having a release coating consisting essentially of polymerized amphiphilic molecules that are capable of self-assembly and that are self-assembled on said surfaces.

10. The mold of claim 9 wherein said coating is substantially continuous and has a substantially uniform thickness that is not greater than about 10 nanometers.

11. The mold of claim 9 wherein said coating is formed by a film forming substance consisting essentially of RmSiXn where R is a substituted silane, a substituted siloxane or an apolar alkyl or alkyl ether or a fluorinated alkyl or alkyl ether group of about 6-30 carbon atoms, where m plus n equal four, and wherein x is selected from the group consisting of halogens, hydroxy and alkoxy.

12. The mold of claim 9 wherein said coating is formed by a film forming substance consisting essentially of RmSiXn where R is apolar alkyl or alkyl ether or a fluorinated alkyl or alkyl ether group of about 6-30 carbon atoms, where m plus n equal four, and wherein x is selected from the group consisting of halogens, hydroxy and alkoxy.

13. A reusable mold assembly for molding optical lenses, said mold having separable parts that include a pair of spaced-apart generally opposite glass molds having curved inner surfaces, said surfaces being coated with a release coating consisting essentially of polmerized amphiphilic molecules that are capable of self-assembly and that are self-assembled on said surfaces, said coating being substantially continuous and having a thickness not greater than about 10 nanometers.

14. The mold of claim 13 wherein said mold parts include an elastic peripheral ring for separately holding said glass molds in predetermined spaced-apart relationship.

15. The mold of claim 13 wherein said molecules are chemically bonded to said surfaces.

16. A mold internally shaped for casting optical lenses therein and having internal surfaces coated with a film in accordance with the method of:

providing a composition of polymerizable amphiphilic molecules capable of self-assembly dispersed in a non-aqueous carrier having a thickness sufficient to inhibit diffusion of moisture into said composition and to inhibit agglomeration of said molecules within said composition;

applying said composition to said mold surfaces;

leaving said composition on said surfaces for a sufficient period of time to allow a sufficient number of said molecules to migrate from said composition toward said surfaces and to spontaneously self-assemble in-situ on said surfaces and attach themselves thereto to form a substantially continuous thin film thereon;

and removing the excess of said composition from said surfaces.

17. The mold of claim 16 wherein said step of providing a composition is carried out by providing a composition that consists essentially of said molecules and said carrier and that may include one or more of a dye for imparting color to said film, a catalyst for speeding up formation of said film and attachment of same to said surface, or a quencher for neutralizing acid fumes generated by formation of said film and attachment of same to said surface.

* * * * *